(12) United States Patent
Zhang et al.

(10) Patent No.: US 11,018,204 B1
(45) Date of Patent: May 25, 2021

(54) DISPLAY PANEL AND DISPLAY DEVICE

(71) Applicant: SHANGHAI TIANMA AM-OLED CO., LTD., Shanghai (CN)

(72) Inventors: Peng Zhang, Shanghai (CN); Xinzhao Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/832,963

(22) Filed: Mar. 27, 2020

(30) Foreign Application Priority Data

Jan. 2, 2020 (CN) .......................... 202010001898.X

(51) Int. Cl.
*H01L 27/32* (2006.01)
(52) U.S. Cl.
CPC ........ *H01L 27/323* (2013.01); *H01L 27/3246* (2013.01); *H01L 27/3276* (2013.01)
(58) Field of Classification Search
None
See application file for complete search history.

(56) References Cited

U.S. PATENT DOCUMENTS

| | | | |
|---|---|---|---|
| 2018/0059862 A1* | 3/2018 | Zeng | G06F 3/0443 |
| 2018/0095571 A1* | 4/2018 | Park | H01L 51/5203 |
| 2018/0348924 A1* | 12/2018 | Li | G06F 3/04164 |
| 2019/0165048 A1* | 5/2019 | Kim | H01L 51/0097 |
| 2020/0350512 A1* | 11/2020 | Guo | H01L 27/3276 |
| 2020/0411596 A1* | 12/2020 | Guo | H01L 27/3258 |

\* cited by examiner

*Primary Examiner* — Duane N Taylor, Jr.
(74) *Attorney, Agent, or Firm* — Alston & Bird LLP

(57) ABSTRACT

Provided is a display panel including: a light-emitting substrate; and a touch substrate. The touch substrate includes: touch units, first touch lines, and first connection structures, all of which are arranged at a side of the touch substrate facing the light-emitting substrate. Each first touch line has one end electrically connected to one touch unit and another end electrically connected to one first connection structure. The light-emitting substrate includes: second connection structures disposed in a non-display area, corresponding to the first connection structures and arranged at a side of the light-emitting substrate facing the touch substrate; and a light-emitting layer disposed in a display area and including a first electrode, a second electrode, and an organic light-emitting layer. Each second connection structure includes a first secondary electrode in electrical contact with one first connection structure. The first secondary electrode and the first electrode are arranged in a same layer.

20 Claims, 6 Drawing Sheets

DISPLAY PANEL AND DISPLAY DEVICE

CROSS-REFERENCE TO RELATED APPLICATIONS

The present application claims the benefit of priority to Chinese Patent Application No. CN202010001898.X, filed on Jan. 2, 2020, the content of which is incorporated herein by reference in its entirety.

TECHNICAL FIELD

The present disclosure relates to the field of display technologies, and in particular, to a display panel and a display device.

BACKGROUND

Touch display panels are in general divided into a resistive touch display panel, a capacitive touch display panel, an optical touch display panel, an ultrasonic touch display panel, and an electromagnetic touch display panels according to different sensing principles. The capacitive touch display panel has become a main touch mode of the display panel with development of smart phones.

As consumers put more and more requirements on thin and light bodies and high transmittance for mobile phones, notebook computers and other terminal products, an embedded capacitive touch display panel has become a research hotspot for display technicians. For an organic light-emitting display panel, the embedded capacitive touch technology requires a touch electrode to be disposed on another substrate opposite to a light-emitting substrate. Considering cost and reliability, one integrated circuit (IC) chip shall control two functions including a display function and a touch function. Thus, how to achieve transmission of touch signals between the IC chip and touch electrodes located on different substrates needs a technical solution.

SUMMARY

Embodiments of the present disclosure provide a display panel and a display device including the display panel.

In a first aspect, an embodiment of the present disclosure provides a display panel, including: a light-emitting substrate; and a touch substrate having two sides, one of which faces the light-emitting substrate. The touch substrate includes: a plurality of touch units, a plurality of first touch lines, and a plurality of first connection structures; the plurality of touch units, the plurality of first touch lines, and the plurality of first connection structures are all arranged the a side of the touch substrate facing the light-emitting substrate; and each of the plurality of first touch lines has one end electrically connected to one of the plurality of touch units and another end electrically connected to one of the plurality of first connection structures. The light-emitting substrate has a display area and a non-display area adjacent to the display area disposed on a side facing the touch substrate, and includes: a plurality of second connection structures provided in the non-display area, wherein the plurality of second connection structures each is configured to associate to one of the plurality of first connection structures; and wherein the light-emitting substrate further includes a light-emitting layer disposed in the display area, wherein the light-emitting layer includes a first electrode, a second electrode, and an organic light-emitting layer, wherein the first electrode is arranged to be opposite to the second electrode, the organic light-emitting layer is arranged between the first electrode and the second electrode, and the first electrode is arranged at a side of the second electrode facing the touch substrate. Each of the plurality of second connection structures includes a first secondary electrode in electrical contact with the associated one of the plurality of first connection structures, the first secondary electrode and the first electrode being arranged in a same layer.

In a second aspect, an embodiment of the present disclosure provides a display device including the display penal described in the first aspect, and the display device is a wearable display device.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

In the description of this specification, it should be understood that the terms "substantially", "basically" "approximately", "about", "almost" and "roughly" described in the claims and embodiments of the present disclosure indicate a value that can be generally agreed within a reasonable process operation range or tolerance range, rather than an exact value.

It should be understood that, although an electrode may be described using the terms of "first", "second", "third", etc., in the embodiments of the present disclosure, the electrode will not be limited to these terms. These terms are merely used to distinguish symmetric axes from one another. For example, without departing from the scope of the embodiments of the present disclosure, a first electrode may also be referred to as a second electrode, and similarly, a second electrode may also be referred to as a first electrode.

The present disclosure provides a solution to the problems existing in the related art.

Figure 1:
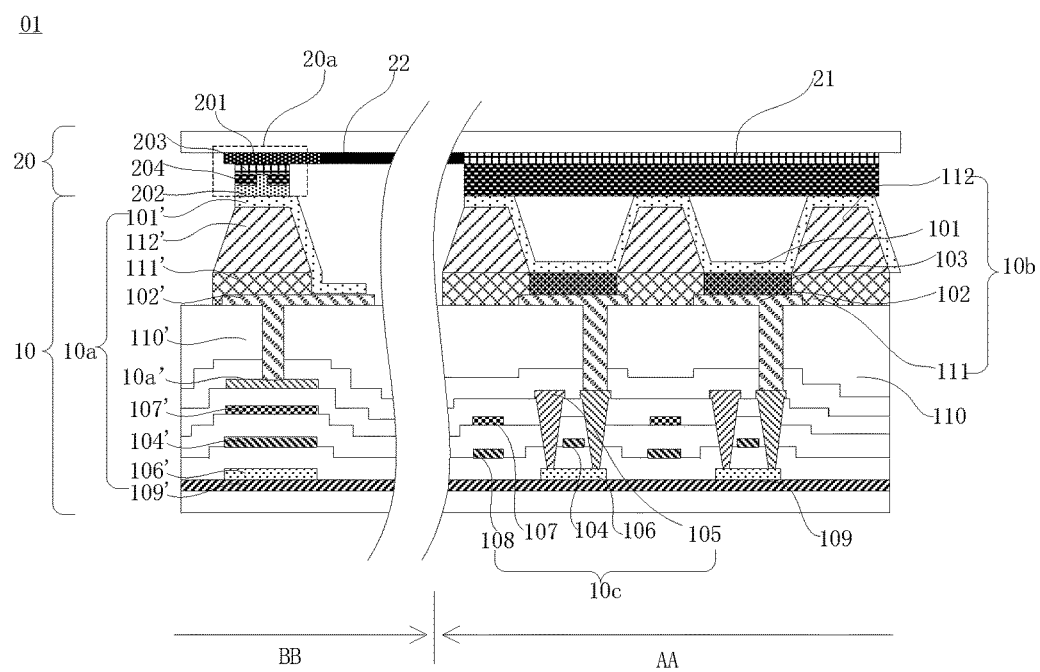
FIG. 1 is a schematic cross sectional view of a display panel according to an embodiment of the present disclosure.
Figure 2:
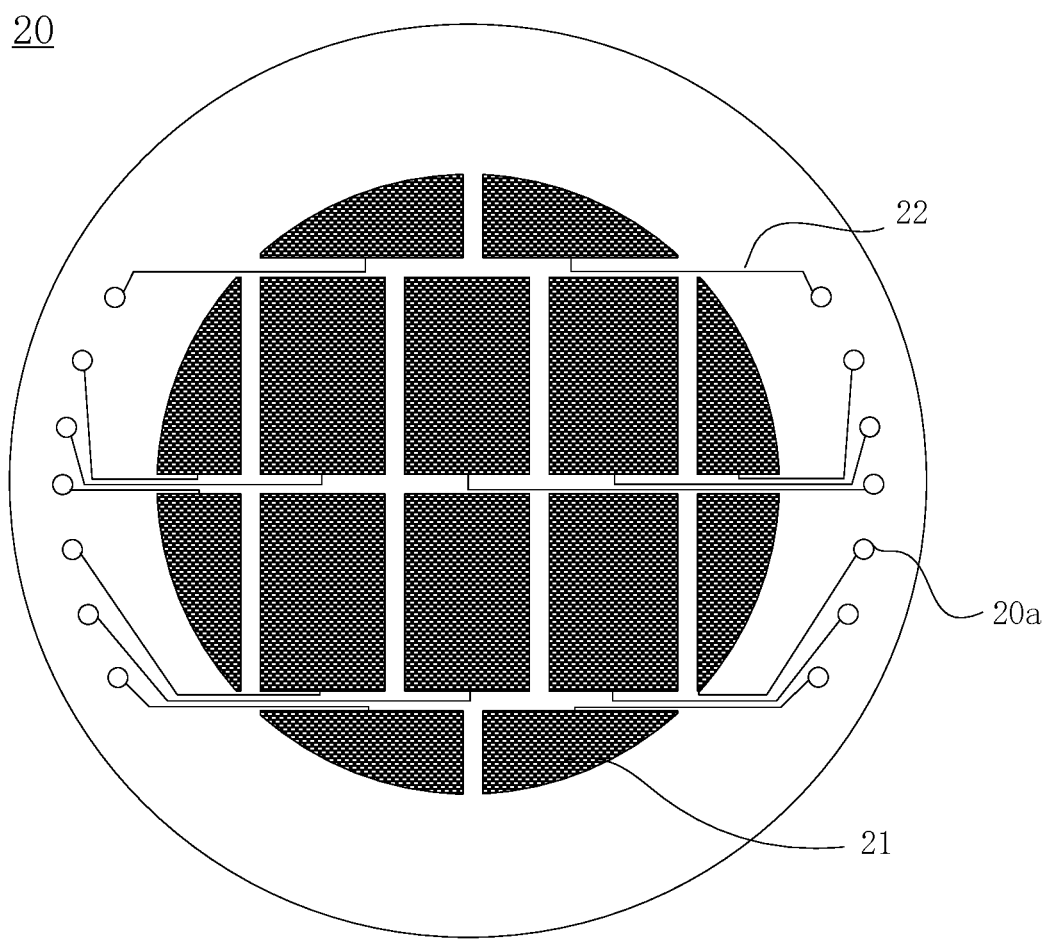
FIG. 2 is a schematic plan view of a touch substrate according to an embodiment of the present disclosure.
Figure 3:
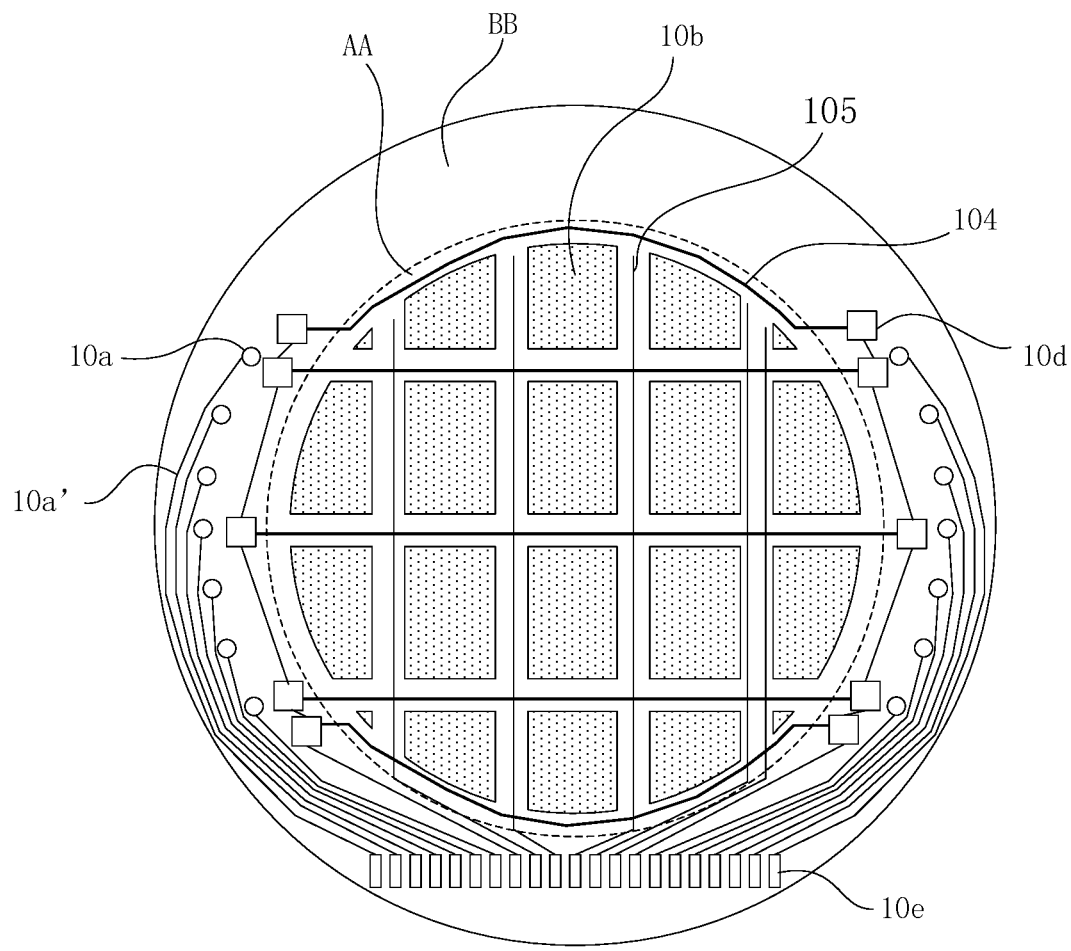
FIG. 3 is a schematic plan view of a light-emitting substrate according to an embodiment of the present disclosure.

An embodiment of the present disclosure provides a display panel as shown in FIG. 1, FIG. 2, and FIG. 3. FIG. 1 is a schematic cross sectional view of a display panel according to an embodiment of the present disclosure; FIG. 2 is a schematic plan view of a touch substrate according to an embodiment of the present disclosure; and FIG. 3 is a schematic plan view of a light-emitting substrate according to an embodiment of the present disclosure. As shown in FIG. 1, a display panel 01 includes a light-emitting substrate 10 and a touch substrate 20 that are opposite to each other.

With reference to FIG. 1 and FIG. 2, the touch substrate 20 includes: a plurality of touch units 21, a plurality of first touch lines 22, and a plurality of first connection structures 20a. With reference to FIG. 1, the touch units 21, the first touch lines 22 and the first connection structures 20a are arranged at a side of the touch substrate 20 facing the light-emitting substrate 10. Moreover, as shown in FIG. 1 and FIG. 2, one end of the first touch line 22 is electrically connected to the touch unit 21, and the other end of the first touch line 22 is electrically connected to the first connection structure 20a. That is, for the display panel provided by this embodiment of the present disclosure, at least a part of the touch units 21 for implementing touch is arranged inside the display panel, so as to facilitate a thin and light appearance of the display panel. In addition, the first touch line 22 is connected to the touch unit 21 and the first connection structure 20a, so that a touch signal obtained by the first connection structure 20a from the light-emitting substrate 10 can be transmitted to the touch unit 21.

With reference to FIG. 1 and FIG. 3, the light-emitting substrate 10 has a display area AA and a non-display area BB that are adjacent to each other. The non-display area BB is disposed with a plurality of second connection structures 10a corresponding to the first connection structures 20a, and the second connection structures 10a are arranged at a side of the light-emitting substrate 10 facing the touch substrate 20. The second connection structures 10a are arranged correspondingly to the first connection structures 20a, so that one set of the first connection structure 20a and the second connection structure 10a correspond to one touch unit 21. Thus, one set of the first connection structure 20a and the second connection structure 10a can be dedicatedly used to transmit a touch signal of the corresponding touch unit 21.

With further reference to FIG. 1, the display area AA is disposed with a light-emitting layer 10b. The light-emitting layer 10b includes a first electrode 101, a second electrode 102, and an organic light-emitting layer 103. Here, the first electrode 101 and the second electrode 102 are opposite to each other, and the organic light-emitting layer 103 is arranged between the first electrode 101 and the second electrode 102. The first electrode 101 is arranged at a side of the second electrode 102 facing the touch substrate 20. That is, the first electrode 101 and the second electrode 102 are electrodes for controlling light emission of the organic light-emitting layer 103, and the first electrode is the uppermost conductive layer in the display area AA. It should be noted that the organic light-emitting layer 103 should include an organic light-emitting material layer. In addition, the organic light-emitting layer 103 may further include a hole transport layer, a hole injection layer, an electron transport layer, an electron injection layer and the like. In this embodiment of the present disclosure, these layers are represented only by the organic light-emitting layer 103.

Further, with further reference to FIG. 1, The second connection structure 10a in the non-display area BB includes a first secondary electrode 101' arranged in the same layer as the first electrode 101 in the display area AA, and the first secondary electrode 101' of the second connection structure 10a is in electrical contact with the corresponding first connection structure 20a. Since the first electrode 101 of the light-emitting substrate 10 is a conductive layer closest to the touch substrate 20 in the display area AA, the first secondary electrode 101' arranged in the same layer as the first electrode 101 is a conductive layer of the light-emitting substrate 10 closest to the touch substrate 20 in the non-display area BB. Thus, when the first connection structure 20a of the touch substrate 20 is in electrical contact with the first secondary electrode 101' of the light-emitting substrate 10, that is, it is in contact with the highest conductive layer of the light-emitting substrate 10 in the non-display area BB, the first connection structure 20a can be in contact with the first secondary electrode 101' as much as possible, thereby improving conductivity between the two. Therefore, the touch signal can be reliably transmitted between the light-emitting substrate 10 and the touch substrate 20.

It should be noted that, in the display panel provided in this embodiment of the present disclosure, each layer of the second connection structure 10a is the same layer as at least one layer of the light-emitting substrate 10 in the display area AA, that is, the second connection structure 10a includes no new layer compared with the layers of the light-emitting substrate 10 in the display AA. Therefore, there is no need to provide an additional manufacturing process on the basis of the existing manufacturing process of the display panel, thereby saving cost and time.

In addition, in order to allow the first secondary electrode 101' arranged in the uppermost layer of the second connection structure 10a to have a sufficient height to be in electrical contact with the first connection structure 20a of the touch substrate 20, the second connection structure 10a basically includes all layers of the light-emitting substrate 10 in the display AA. It should be noted that the layers of the second connection structure 10a may be all layers of the light-emitting substrate 10 in the display area AA. In addition, as shown in FIG. 1, it is also possible that the layers of the second connection structure 10a may be all layers of the light-emitting substrate 10 in the display area AA except the organic light-emitting layer 103.

As shown in FIG. 1, in addition to the first secondary electrode 101' and the second secondary electrode 102' that are arranged in the same layer as the light-emitting layer 10b, the second connection structure 10a further includes a secondary pixel definition layer 111' and a secondary support structure 112'. The secondary pixel definition layer 111' is arranged in the same layer as a pixel definition layer 111 in the display area AA. The pixel definition layer 111 is arranged on the second electrode 102, and the pixel definition layer 111 is disposed with an opening for receiving the organic light-emitting layer 103 and making the organic light-emitting layer 103 be electrically connected to the second electrode 102. Therefore, the pixel definition layer 111 is configured to define a light-emitting area of the light-emitting layer 10b of the light-emitting substrate 10. Here, the secondary support structure 112' is arranged in the same layer as a first support structure 112. The first support structure 112 is arranged on the pixel definition layer 111. The first support structure 112 is configured to form a gap between the light-emitting substrate 10 and the touch substrate 20, thereby preventing the touch substrate 20 from abrading the light-emitting substrate 10.

With reference to FIG. 1, the second connection structure 10a further includes a layer that is arranged in the same as each insulation layer in the display area AA. For example, the light-emitting substrate 10 in the display area AA includes a planarization layer 110, and the planarization layer is arranged between the light-emitting layer 10b and a driving circuit layer 10c, so that the layer on the driving circuit 10c has a flat surface. The light-emitting substrate 10 in the non-display area BB includes a secondary planarization layer 110' arranged in the same layer as the planarization layer.

With reference to FIG. 1, the second connection structure 10a further includes a layer that is arranged in the same layer as the driving circuit 10c of the light-emitting substrate 10 in the display area AA. As shown in FIG. 1, the driving circuit 10c includes an active layer 106, a gate electrode (arranged in the same layer as a gate line 104), and a source/drain electrode (arranged in the same layer as a data line 105), for forming a transistor. The driving circuit 10c further includes a first electrode plate 107 and a second electrode plate 108 (arranged in the same layer as the gate line 104) for forming a capacitor. In addition, the display area AA is further provided with a buffer layer 109 arranged under the transistor. Correspondingly, the second connection structure 10a of the light-emitting substrate 10 includes: a secondary active layer 106' arranged in the same layer as the active layer 106, a secondary gate line layer 104' arranged in the same layer as the gate line 104, a secondary electrode plate layer 107' arranged in the same layer as the first electrode plate 107, and a secondary data line layer 105' arranged in the same layer as the data line 105.

Figure 4:
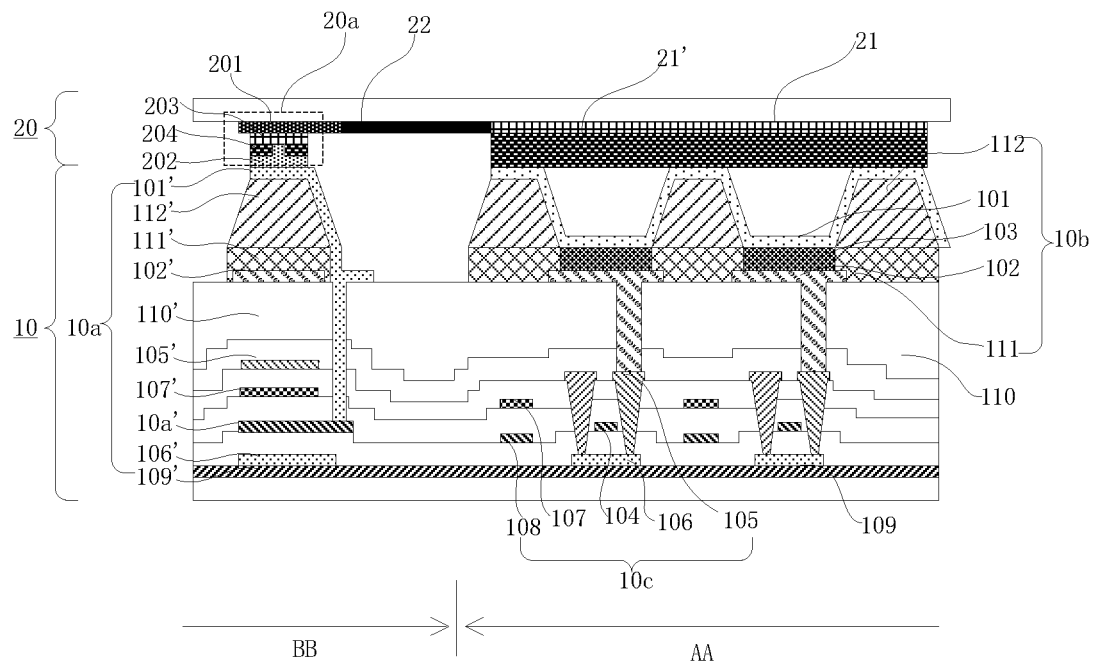
FIG. 4 is a schematic cross sectional view of a display panel according to another embodiment of the present disclosure.

Further, with reference to FIG. 1, FIG. 3, and FIG. 4, in which FIG. 4 is a schematic diagram of a display panel according to another embodiment of the present disclosure, the light-emitting substrate 10 includes a plurality of gate lines 104 and a plurality of data lines 105 in the display area AA. The gate lines 104 and the data lines 105 are configured to provide signals for controlling light emission of the light-emitting layer 10b. The signal in the gate line 104 controls on and off of a switch transistor connected to the light-emitting layer 10b, and the data line 105 provides a display signal for the light-emitting layer 10b.

Further, the light-emitting substrate 10 further includes a plurality of second touch lines 10a' in the non-display area BB. The second touch line 10a' is electrically connected to the second connection structure 10a. The second touch line 10a' is arranged in the same layer as at least one of the gate line 104 and the data line 105. That is, the second touch line 10a' for transmitting a touch signal on the light-emitting substrate 10 reuses an inherent layer of the display panel, thereby saving manufacturing cost and time.

In addition, with reference to FIG. 3, the light-emitting substrate 10 further includes a binding structure 10e in the non-display area BB, and the binding structure 10e is electrically connected to the second touch line 10a' and is bound to at least one of an integrated circuit and a flexible printed circuit board. In view of this, the touch signal received or outputted by the touch unit 21 of the touch substrate 20 can be transmitted through the second touch line 10a' to the integrated circuit and the flexible printed circuit board bound to the light-emitting substrate 10.

In addition, with further reference to FIG. 3, the light-emitting substrate 10 includes a gate driving circuit 10d in the non-display area BB, and an output terminal of the gate driving circuit 10d is electrically connected to the gate line 104 for providing a signal to the gate line 104. The second connection structure 10a and the second touch line 10a' are arranged at a side of the gate driving circuit 10d outside of the display area AA. Since different touch operations may cause different touch signals, the touch signals in the second touch line 10a' do not have a constant voltage/current value. The second touch line 10a' is arranged at the other side of the display area AA from where the gate driving circuit 10d is, so that the signal line in the display area AA can be prevented from being interfered by an uncontrollable signal in the second touch line 10a'.

In addition, the light-emitting substrate 10 and the touch substrate 20 need to be packaged together. Thus, an encapsulation layer is arranged at a side of the light-emitting substrate 10 in the non-display area BB set away from the display area AA. It should be noted that the second connection structure 10a of the light-emitting substrate 10 in the non-display area BB is arranged at a side of the encapsulation layer close to the display area AA, and the second connection structure 10a includes an organic material layer, such as a secondary planarization layer 110'. The encapsulation layer does not include an organic material layer since organic materials cannot effectively prevent water and oxygen and thus may be damaged by water and oxygen. Moreover, the second connection structure 10a is arranged at the side of the encapsulation layer close to the display area AA, so that the encapsulation layer can prevent water and oxygen for the organic material layer of the second connection structure 10a, thereby protecting the second connection structure 10a.

With reference to FIG. 1, the second touch line 10a' may be arranged in the same layer as the data line 105 of the light-emitting substrate 10 in the display area AA. With reference to FIG. 4, the second touch line 10a' may be arranged in the same layer as the gate line 104 of the light-emitting substrate 10 in the display area AA. It should be noted that, in order to reduce a density of the second touch lines 10a' in a single layer, the second touch lines 10a' can also be distributed into different layers.

It should be noted that, as shown in FIG. 1 and FIG. 4, the second touch line 10a' is arranged in the same layer as at least one of the gate line 104 and the data line 105 of the light-emitting substrate 10 in the display area AA, while the second connection structure 10a further includes a part of the second touch line 10a' arranged in the same layer as the gate line 104 and/or the data line 105. Thus, different layer structures that are arranged in the same layers with the gate line 104 and/or the data line 105 of the light-emitting substrate in the display area AA are insulated from each other. That is, the part of the second connection structure 10a that is in the same layer as the second touch line 10a' is insulated from the same part of another second connection structure 10a.

In an embodiment of the present disclosure, with reference to FIG. 4, the second touch line 10a' is electrically connected to the first secondary electrode 101' of the second connection structure 10a through a first through hole. In this way, the second touch line 10a' is directly electrically connected to the first secondary electrode 101' of the second connection structure 10a, thereby reducing contact resistance and thus improving an accuracy of the touch signal.

Figure 5:
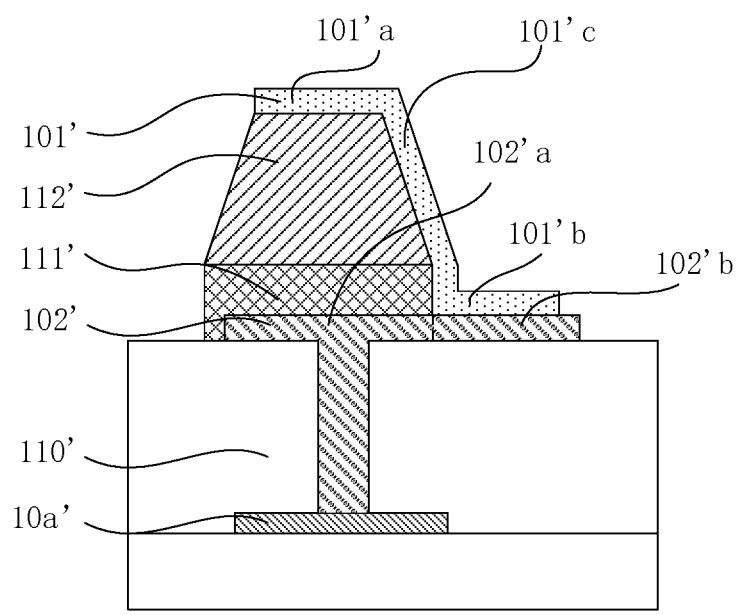
FIG. 5 is an enlarged partial cross sectional view of a second connection structure according to an embodiment of the present disclosure.

In an embodiment of the present disclosure, referring to FIG. 1 and FIG. 5, in which FIG. 5 is a partially enlarged schematic diagram of a second connection structure according to an embodiment of the present disclosure. As shown in FIG. 1, the second connection structure 10a includes a second secondary electrode 102' arranged in the same layer as the second electrode 102 of the light-emitting substrate 10 in the display area AA.

As shown in FIG. 5, the second secondary electrode 102' includes a first part 102'a and a second part 102'b connected to each other. The first secondary electrode 101' includes a third part 101'a and a fourth part 101'b. With reference to FIG. 1 and FIG. 5, the third part 101'a is at least partially in contact with the first connection structure 20a, the fourth part 101'b is in contact with the second part 102'b, and the second touch line 10a' is electrically connected to the first part 102'a through a second through hole.

In other words, the second touch line 10a' needs to transmit the touch signal to the first secondary electrode 101' of the second connection structure 10a that is in contact with the first connection structure 20a, and this can be specifically achieved by the second secondary electrode 102'. Since the second secondary electrode 102' is arranged between the first secondary electrode 101' and the second touch line 10a', a connection electrode in a direction perpendicular to a thickness of the display panel 01 will not be too long when the second secondary electrode 102' is connected to the second touch line 10a', thereby avoiding breakage of the connection electrode. Meanwhile, when the second secondary electrode 102' is connected to the second touch line 10a' through the second through hole, a manufacturing process of the through hole can be performed simultaneously with a manufacturing process of the through hole of the light-emitting substrate 10 in the display area AA, thereby saving cost and time.

Further, with reference to FIG. 1, for the light-emitting substrate 10 in the display area AA, the second electrode 102 is in contact with the planarization layer 110. Here, the second electrode 102 is arranged on the planarization layer 110. Correspondingly, with reference to FIG. 1 and FIG. 5, the second secondary electrode 102' is in contact with the secondary planarization layer 110'. Here, the second secondary electrode 102' is arranged on the secondary planarization layer 110'. Further, the second part 102'b of the second secondary electrode 102' and the fourth part 101b' of the first secondary electrode 101' are sequentially stacked on the secondary planarization layer 110'. Since the secondary planarization layer 110' has good planarization, it has a flat surface. When the second part 102'b of the second secondary electrode 102' and the fourth part 101b' of the first secondary electrode 101' that are electrically connected to each other are arranged on the secondary planarization layer 110', the two can be in good contact with each other, thereby achieving excellent electrical conductivity therebetween.

In addition, since the pixel definition layer 111 is arranged on the second electrode 102 of the light-emitting substrate 10 in the display area AA, the secondary pixel definition layer 111' of the light-emitting substrate 10 in the non-display area BB is arranged on the second secondary electrode 102'. Since the first support structure 112 is arranged on the pixel definition layer 111 of the light-emitting substrate 10 in the display area AA, the secondary support structure 112' is arranged on the secondary pixel definition layer 111' of the light-emitting substrate 10 in the non-display area BB.

With further reference to FIG. 5, the first secondary electrode 101' further includes a fifth part 101'c. For the first secondary electrode 101', the fifth part 101'c is arranged between the third part 101'a and the fourth part 101'b, and the fifth part 101'c connects the third part 101'a with the fourth part 101'b. That is, the third part 101'a arranged on the secondary support structure 112' is electrically connected to the fourth part 101'b arranged on the second part 102'b through the fifth part 101'c.

A portion of the fifth part 101'c is arranged on a side surface of the secondary pixel definition layer 111', and another portion of the fifth part 101'c is arranged on a side surface of the secondary support structure 112'. The fifth part 101'c is arranged on side surfaces of the secondary support structure 112' and the pixel definition layer 111'. That is, the fifth part 101'c connecting the third part 101'a with the fourth part 101'b is arranged on a partial side surface of the second connection structure 10a instead of being arranged in the through hole. In view of this, when manufacturing the first secondary electrode 101', the fifth part 101'c has a relatively open space, thereby achieving a yield of the fifth part 101'c during the manufacturing process.

Figure 6:
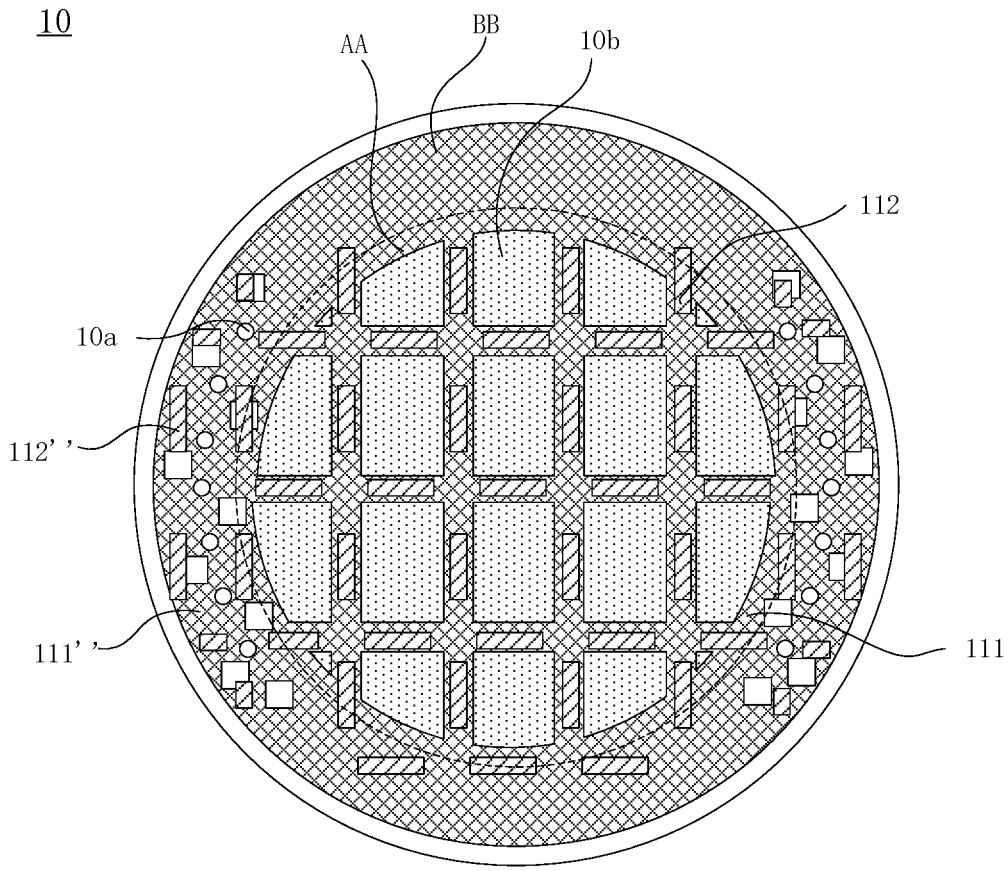
FIG. 6 is a schematic plan view of a light-emitting substrate according to another embodiment of the present disclosure.

FIG. 6 is a schematic plan view of a light-emitting substrate according to another embodiment of the present disclosure. It should be noted that FIG. 6 only shows a structure related to an inventive point of this part, and other omitted structures do not mean that these structures do not exist. As shown in FIG. 6, the non-display area BB is disposed with a plurality of second support structures 112". The second support structure 112" is arranged in the same layer as the first support structure 112 in the display area AA and the secondary support structure 112' of the second connection structure 10a in the non-display area BB. That is, in the non-display area BB, in addition to the secondary support structure 112' that is included in the second connection structure 10a and arranged in the same layer as the first support structure 112 in the display area AA, the second support structure 112" arranged in the same layer as the first support structure in the display area AA is also disposed in the periphery of the second connection structure 10a.

With further reference to FIG. 6, a first pixel definition layer 111" is further disposed in the periphery of the second connection structure 10a, and the first pixel definition layer 111" is arranged in the same layer as the pixel definition layer 111 in the display area AA and the secondary pixel definition layer 111' of the second connection structure 10a in the non-display area BB. That is, in the non-display area BB, in addition to the second pixel definition layer 111' that is included in the second connection structure 10a and arranged in the same layer as the pixel definition layer 111 in the display area AA, the first pixel definition layer 111" arranged in the same layer as the definition layer 111 in the display area AA is also disposed in the periphery of the second connection structure 10a.

With reference to FIG. 1 and FIG. 4, a first planarization layer is further disposed in the periphery of the second connection structure 10a, and the first planarization layer is arranged in the same layer as the planarization layer 110.

A purpose of providing the second support structure 112", the first pixel definition layer 111", and the first planarization layer in the periphery of the second connection structure 10a lies in that, in a process of exposing, developing, and curing the layers in the display area AA and the non-display area BB to form a part of layers of the light-emitting layer 10b and a part of layers of the second connection structure 10a, the layers formed in the display area AA and the non-display area BB can be allowed have a consistent height. Moreover, for the purpose of the consistent height for layers in the display area AA and the non-display area BB, thicknesses and patterns of the second support structure 112", the first pixel definition layer 111" and the first planarization layer and thicknesses and patterns of the corresponding films in the display area AA shall be as close as possible, so that the exposure intensity received during the exposure is consistent.

With further reference to FIG. 1, FIG. 4 and FIG. 5, a surface of the first connection structure 20a of the touch substrate 20 facing the second connection structure 10a of the light-emitting substrate 10 is a first surface, and an area of the third part 101'a of the first secondary electrode 101' is larger than or equal to an area of the first surface. To be specific, an orthographic projection of the first surface onto a plane of the third part 101'a is covered by the third part 101'a. That is, the first connection structure 20a is in contact with the first secondary electrode 101' of the second connection structure 10a, and a contact area therebetween is equal to the area of the first surface of the second connection structure 20a. That is, the first surface of the first connection structure 20a facing the light-emitting substrate 10 is completely in contact with the third part 101'a of the first secondary electrode 101'. Meanwhile, the third part 101'a is completely in contact with the first surface, or includes another portion not in contact with the first surface in addition to that portion in contact with the first surface. Such design can ensure good contact between the first secondary electrode 101' and the first connection structure 20a.

Figure 7:
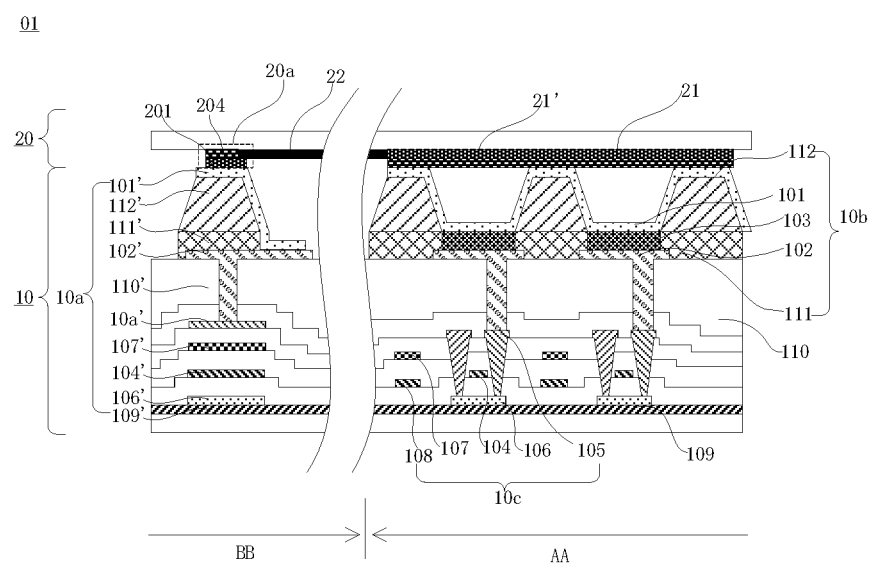
FIG. 7 is a schematic cross sectional view of a display panel according to still another embodiment of the present disclosure.

FIG. 7 is a schematic diagram of a display panel according to still another embodiment of the present disclosure. As shown in FIG. 7, the first connection structure 20a includes a first metal layer 201, and the first metal layer 201 is connected to the first contact line 22 and is arranged in the same layer as the first contact line 22. The expression "being arranged in the same layer" herein means that the two are formed by the same material in a same process. The first metal layer 201 is at least partially in contact with the first secondary electrode 101' of the second connection structure 10a. That is, an electrical contact between the first connection structure 20a and the second connection structure 10a is achieved by the first metal layer 201 of the first connection structure 20a being in contact with the first secondary electrode 101' of the second connection structure 10a.

It should be noted that, for the light-emitting substrate 10, since the layers of the second connection structure 10a basically include all layers in the display area AA, a height of the first secondary electrode 101' of the second connection structure 10a is basically the same as the largest height of the first electrode 101 in the display area AA. In order to achieve that the first secondary electrode 101' of the second connection structure 10a in the non-display area BB is in contact with the first connection structure 20a but the highest position of the first electrode 101 in the display area is not in contact with the touch unit 21 of the touch substrate 20, the height of the first connection structure 20a shall be greater than the height of the touch unit 21 in a direction from the touch substrate 20 towards the light-emitting substrate 10.

In an embodiment, with reference to FIG. 7, in order to increase the height of the first connection structure 20a, that is, to increase the height of the first metal layer 201, a first insulation layer 204 is disposed at a side of the first metal layer 201 facing away from the light-emitting substrate 10. Thus, in the direction from the touch substrate 20 towards the light-emitting substrate 10, the height of the first metal layer 201 is greater than the height of the touch unit 21. Meanwhile, in order to prevent the first electrode 101 of the light-emitting substrate 10 from being in contact with the touch unit 21 of the touch substrate 20 under a larger pressure, a second insulation layer 21' is disposed at a side of the touch unit 21 close to the light-emitting substrate.

In addition, when the touch unit 21 and the first touch line 22 are arranged in the same layer, since the touch unit 21 and the first touch line 22 are formed by the same metal material, in order to avoid light blocking, the touch unit 21 can be designed into a metal grid structure.

In an embodiment of the present disclosure, with reference to FIG. 1 and FIG. 4, the first connection structure 20a includes a first metal layer 201, a first transparent conductive layer 202, a second transparent conductive layer 203, and a first insulation layer 204. Here, the first transparent conductive layer 202 is at least partially in contact with the first secondary electrode 101', the first insulation layer 204 is arranged between the second transparent conductive layer 203 and the first transparent conductive layer 202, and the first transparent conductive layer 202 is electrically connected to the second transparent conductive layer 203 through a through hole. The second transparent conductive layer 203 is arranged on the first metal layer 201, and the second transparent conductive layer 203 is arranged between the first transparent conductive layer 202 and the first metal layer 201. Thus, the first metal layer 201 is electrically connected to the first transparent conductive layer 202. In addition, the first metal layer 201 is connected to the first touch line 22 and is arranged in the same layer as the first touch line 22, and the touch unit 21 is arranged in the same layer as the second transparent conductive layer 203.

The touch unit 21 is arranged in the same layer as the second transparent conductive layer 203, so that the touch unit 21 can be transparent and conductive, and thus the touch unit can be designed into one piece. In addition, the first connection structure 20a is composed of the first metal layer 201, the first transparent conductive layer 202, the second transparent conductive layer 203, and the first insulating layer 204. The height of the first connection structure 20a can be increased, and stacking more than one conductive layer can reduce the contact resistance.

Figure 8:
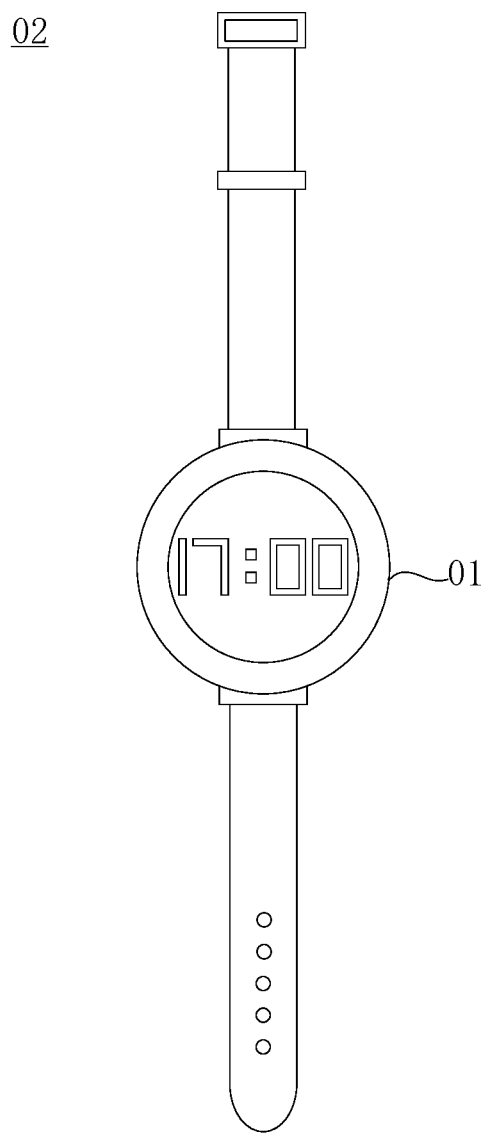
FIG. 8 is a schematic diagram of a display device according to an embodiment of the present disclosure.

In an embodiment of the present disclosure, a display device is further provided. FIG. 8 is a schematic diagram of a display device according to an embodiment of the present disclosure. As shown in FIG. 8, the display device 01 provided according to this embodiment of the present disclosure includes the display panel 01 provided in any one of the foregoing embodiments. In addition, the display device can be a wearable display device, such as a watch.

For the display panel 01 included in the display device provided by this embodiment of the present disclosure, the layer at which the second connection structure 10a located at a side of the light-emitting substrate 10 is in contact with the first connection structure 20a located at a side of the touch substrate 20 is the first secondary electrode 101', and the first secondary electrode 101' is arranged in the same layer as the first electrode 101 located at the uppermost layer of the light-emitting substrate 10 in the display area. Thus, for the display panel provided in this embodiment of the present disclosure, the layer at which the second connection structure 10a of the light-emitting substrate 10 is in contact with the first connection structure 20a located at a side of the touch substrate 20 is the uppermost conductive layer of the light-emitting substrate 10. Therefore, while achieving that the touch signal in the light-emitting substrate 10 can be transmitted to the touch unit 21 of the touch substrate 20 through the first connection structure 20a and the second connection structure 10a, the first connection structure 20a can be allowed to be in contact with the second connection structure 10a with the largest area, thereby achieving the touch performance of the display device.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
a light-emitting substrate; and
a touch substrate having two sides, one of which faces the light-emitting substrate,
wherein the touch substrate comprises: a plurality of touch units, a plurality of first touch lines, and a plurality of first connection structures; wherein the plurality of touch units, the plurality of first touch lines, and the plurality of first connection structures are all arranged at the side of the touch substrate facing the light-emitting substrate; and wherein each of the plurality of first touch lines has one end electrically connected to one of the plurality of touch units, and another end electrically connected to one of the plurality of first connection structures;
wherein the light-emitting substrate has a display area and a non-display area adjacent to the display area disposed on a side facing the touch substrate, wherein said side of said light-emitting substrate comprises: a plurality of second connection structures provided in the non-display area, wherein the plurality of second connection structures each is configured to associate to one of the plurality of first connection structures; and wherein the light-emitting substrate further comprises a light-emitting layer disposed in the display area, wherein the light-emitting layer comprises a first electrode, a second electrode, and an organic light-emitting layer, wherein the first electrode is arranged to be opposite to the second electrode, the organic light-emitting layer is arranged between the first electrode and the second electrode, and the first electrode is arranged at a side of the second electrode facing the touch substrate; and
wherein each of the plurality of second connection structures comprises a first secondary electrode in electrical contact with the associated one of the plurality of first connection structures, wherein the first secondary electrode and the first electrode are arranged in a same layer.

2. The display panel according to claim 1, wherein the light-emitting substrate further comprises:
a plurality of gate lines disposed in the display area;
a plurality of data lines disposed in the display area; and
a plurality of second touch lines disposed in the non-display area,
wherein the plurality of second touch lines is electrically connected to the plurality of second connection structures in one to one correspondence, and is arranged in the same layer as at least one of the plurality of gate lines and the plurality of data lines.

3. The display panel according to claim 2, wherein the light-emitting substrate further comprises:
a binding structure disposed in the non-display area,
wherein the binding structure is electrically connected to every one of the plurality of second touch lines, and is bound to at least one of an integrated circuit and a flexible printed circuit board.

4. The display panel according to claim 2, wherein the light-emitting substrate further comprises:
a gate driving circuit disposed in the non-display area,
wherein the gate driving circuit comprises an output terminal electrically connected to the plurality of gate lines, and
wherein the plurality of second connection structures and the plurality of second touch lines are arranged at a side of the gate driving circuit farther away from the display area.

5. The display panel according to claim 2, wherein each of the plurality of second touch lines is electrically connected to the first secondary electrode through a first through hole.

6. The display panel according to claim 2, wherein each of the plurality of second connection structures further comprises a second secondary electrode arranged in a same layer as the second electrode, and wherein the second secondary electrode comprises a first part and a second part that are connected to each other;
wherein the first secondary electrode comprises a third part and a fourth part, wherein the third part is at least partially in contact with at least one of the plurality of first connection structures, and the fourth part is in contact with the second part; and
wherein each of the plurality of second touch lines is electrically connected to the first part through a second through hole.

7. The display panel according to claim 6, wherein the light-emitting substrate further comprises:
a planarization layer disposed in the display area;
wherein the light-emitting layer is arranged at a side of the planarization layer facing the touch substrate, and wherein the second electrode is in contact with the planarization layer; and
wherein each of the plurality of second connection structures comprises a secondary planarization layer, wherein the secondary planarization layer is arranged in a same layer as the planarization layer, and wherein the second part of the second secondary electrode and the fourth part of the first secondary electrode are sequentially stacked on the secondary planarization layer.

8. The display panel according to claim 7, wherein the display area in the light-emitting substrate further comprises a pixel definition layer and a first support structure, wherein the pixel definition layer is arranged on the second electrode, an wherein d the first support structure is arranged on the pixel definition layer;
wherein each of the plurality of second connection structures further comprises a secondary pixel definition layer and a secondary support structure, wherein the secondary pixel definition layer is arranged in a same layer as the pixel definition layer, and wherein the secondary support structure is arranged in a same layer as the first support structure, and wherein the secondary pixel definition layer is arranged on the second secondary electrode, and wherein the secondary support structure is arranged on the secondary pixel definition layer.

9. The display panel according to claim 8, wherein the first secondary electrode further comprises a fifth part arranged between the third part and the fourth part, and wherein the fifth part connects the third part with the fourth part, and wherein a portion of the fifth part is arranged on a side surface of the secondary pixel definition layer, and another portion of the fifth part is arranged on a side surface of the secondary support structure.

10. The display panel according to claim 8, wherein the light-emitting substrate further comprises:

a plurality of second support structures disposed in the non-display area, wherein the plurality of second support structure, the first support structure and the secondary support structure are arranged in a same layer.

11. The display panel according to claim 8, wherein a first pixel definition layer is disposed in a periphery of the plurality of second connection structures, and wherein the first pixel definition layer is arranged in the same layer as the pixel definition layer.

12. The display panel according to claim 8, wherein a first planarization layer is disposed in a periphery of the plurality of second connection structures, and wherein the first planarization layer is arranged in the same layer as the planarization layer.

13. The display panel according to claim 6, wherein a surface of each of the plurality of first connection structures facing one of the plurality of second connection structures is a first surface, and wherein an area of the third part is larger than or equal to an area of the first surface; and wherein an orthographic projection of the first surface onto a plane of the third part is covered by the third part.

14. The display panel according to claim 1, wherein each of the plurality of first connection structures comprises a first metal layer, and the first metal layer is connected to one of the plurality of first touch lines and is arranged in a same layer as the one of the plurality of first touch lines; and wherein the first metal layer is at least partially in contact with the first secondary electrode.

15. The display panel according to claim 14, wherein the plurality of touch units is arranged in the same layer as the plurality of first touch lines, and wherein the plurality of touch units is of a metal grid structure.

16. The display panel according to claim 1, wherein each of the plurality of first connection structures comprises a first metal layer and a first transparent conductive layer, and wherein the first metal layer is connected to one of the plurality of first touch lines and is arranged in the same layer as the one of the plurality of first touch lines; and wherein the first metal layer is electrically connected to the first transparent conductive layer; and wherein the first transparent conductive layer is at least partially in contact with the first secondary electrode.

17. The display panel according to claim 16, wherein each of the plurality of first connection structures further comprises a second transparent conductive layer arranged on the first metal layer and between the first transparent conductive layer and the first metal layer, and wherein an insulation layer is disposed between the second transparent conductive layer and the first transparent conductive layer, and wherein the first transparent conductive layer is electrically connected to the second transparent conductive layer through a through hole.

18. The display panel according to claim 17, wherein the plurality of touch units is arranged in a same layer as the second transparent conductive layer.

19. A display device, comprising a display panel, wherein the display device is a wearable display device, and wherein the display panel comprises:

a light-emitting substrate; and a touch substrate opposite to the light-emitting substrate, wherein the touch substrate comprises: a plurality of touch units, a plurality of first touch lines, and a plurality of first connection structures; the plurality of touch units, the plurality of first touch lines, and the plurality of first connection structures are all arranged at a side of the touch substrate facing the light-emitting substrate; and each of the plurality of first touch lines has one end electrically connected to one of the plurality of touch units and another end electrically connected to one of the plurality of first connection structures;

wherein the light-emitting substrate has a display area and a non-display area adjacent to the display area disposed on a side facing the touch substrate, wherein said side of said light-emitting substrate comprises: a plurality of second connection structures disposed in the non-display area, the plurality of second connection structures each is configured to associate to one of the plurality of first connection structures; and wherein the display panel further comprises a light-emitting layer disposed in the display area, wherein the light-emitting layer comprises a first electrode, a second electrode, and an organic light-emitting layer, the first electrode is arranged to be opposite to the second electrode, the organic light-emitting layer is arranged between the first electrode and the second electrode, and the first electrode is arranged at a side of the second electrode facing the touch substrate; and wherein each of the plurality of second connection structures comprises a first secondary electrode in electrical contact with the associated one of the plurality of first connection structures, wherein the first secondary electrode and the first electrode being arranged in a same layer.

20. The display device according to claim 19, wherein each of the plurality of first connection structures comprises a first metal layer, and wherein the first metal layer is connected to one of the plurality of first touch lines and is arranged in a same layer as the one of the plurality of first touch lines; and wherein the first metal layer is at least partially in contact with the first secondary electrode.

\* \* \* \* \*